United States Patent [19]

Sandhu

[11] Patent Number: 5,399,379
[45] Date of Patent: Mar. 21, 1995

[54] LOW-PRESSURE CHEMICAL VAPOR DEPOSITION PROCESS FOR DEPOSITING HIGH-DENSITY, HIGHLY-CONFORMAL TITANIUM NITRIDE FILMS OF LOW BULK RESISTIVITY

[75] Inventor: Gurtej S. Sandhu, Boise, Id.

[73] Assignee: Micron Semiconductor, Inc., Boise, Id.

[21] Appl. No.: 241,933

[22] Filed: May 11, 1994

Related U.S. Application Data

[63] Continuation of Ser. No. 112,493, Aug. 26, 1993, abandoned, which is a continuation-in-part of Ser. No. 46,685, Apr. 14, 1993, Pat. No. 5,246,881.

[51] Int. Cl.⁶ ............... C23C 16/18; C23C 16/34
[52] U.S. Cl. ................. 427/255.2; 427/255.1; 427/248.1; 427/314
[58] Field of Search ........... 427/255.2, 255.1, 248.1, 427/314; 437/192, 190

[56] References Cited

U.S. PATENT DOCUMENTS

| | | | |
|---|---|---|---|
| 4,842,897 | 6/1989 | Takeuchi et al. | 427/255.2 |
| 5,135,607 | 8/1992 | Hirai | 427/255.2 |
| 5,178,911 | 1/1993 | Gordon et al. | 427/255.2 |

OTHER PUBLICATIONS

Katz et al, "Properties of Titanium Nitride Thin Films Deposited by Rapid-Thermal-Low-Pressure-Metalorganic-Chemical-Vapor-Deposition Technique Using Tetrakis (Dimethylamide) Titanium Precursor", J. Appl. Phys. 70(7) Oct. 1991, pp. 3666–3677.

*Primary Examiner*—Roy V. King
*Attorney, Agent, or Firm*—Angus C. Fox, III

[57] ABSTRACT

A low-pressure chemical vapor deposition process is disclosed for creating high-density, highly-conformal titanium nitride films which have very low bulk resistivity, and which provide excellent step coverage. The process utilizes a metal-organic compound, tetrakis-dialkylamido-titanium $Ti(NR_2)_4$, as the primary precursor, in combination with a halogen gas selected from the group consisting of fluorine, chlorine and bromine. The wafer is heated to a temperature within a range of 200°–600° C. The halogen gas is admitted to the depositiion chamber before the introduction of the primary precursor compound or simultaneously with the primary precursor compound.

20 Claims, 1 Drawing Sheet

LOW-PRESSURE CHEMICAL VAPOR DEPOSITION PROCESS FOR DEPOSITING HIGH-DENSITY, HIGHLY-CONFORMAL TITANIUM NITRIDE FILMS OF LOW BULK RESISTIVITY

RELATED APPLICATIONS

This is a continuation of application Ser. No. 08/112,493, which was filed on Aug. 26, 1993, now abandoned, which is continuation-in-part of application Ser. No. 08/046,685, which was filed on Apr. 14, 1993, and has now issued as U.S. Pat. No. 5,246,881. This application is also related to copending U.S. application Ser. No. 07/898,059, which was filed on Jun. 12, 1993, to copending U.S. application Ser. No. 07/759,298, which was filed on Sep. 13, 1991 and is now abandoned, and to copending U.S. application Ser. No. 8/054,889, which was filed on Apr. 28, 1993 as a file wrapper continuation of the latter application, now abandoned.

FIELD OF THE INVENTION

This invention relates to integrated circuit manufacturing technology and, more specifically, to processes for depositing titanium nitride films via chemical vapor deposition.

BACKGROUND OF THE INVENTION

The compound titanium nitride (TiN) has numerous potential applications because it is extremely hard, chemically inert (although it readily dissolves in hydrofluoric acid), an excellent conductor, possesses optical characteristics similar to those of gold, and has a melting point around 3000° C. This durable material has long been used to gild inexpensive jewelry and other art objects. However, during the last ten to twelve years, important uses have been found for TiN in the field of integrated circuit manufacturing. Not only is TiN unaffected by integrated circuit processing temperatures and most reagents, it also functions as an excellent barrier against diffusion of dopants between semiconductor layers. In addition, TiN also makes excellent ohmic contact with other conductive layers.

In a common application for integrated circuit manufacture, a contact opening is etched through an insulative layer down to a diffusion region to which electrical contact is to be made. Titanium metal is then sputtered over the wafer so that the exposed surface of the diffusion region is coated. The titanium metal is eventually converted to titanium silicide, thus providing an excellent conductive interface at the surface of the diffusion region. A titanium nitride barrier layer is then deposited, coating the walls and floor of the contact opening. Chemical vapor deposition of tungsten or polysilicon follows. In the case of tungsten, the titanium nitride layer provides greatly improved adhesion between the walls of the opening and the tungsten metal. In the case of the polysilicon, the titanium nitride layer acts as a barrier against dopant diffusion from the polysilicon layer into the diffusion region.

At least six techniques are currently available for creating thin titanium nitride films having low bulk resistivity: reactive sputtering; annealing of an already deposited titanium layer in a nitrogen ambient; a high-temperature atmospheric pressure chemical vapor deposition (APCVD) process, using titanium tetrachloride, nitrogen and hydrogen as reactants; a low-temperature APCVD process, using ammonia and $Ti(NR_2)_4$ compounds as precursors; a low-pressure chemical vapor deposition process (LPCVD) process using ammonia and $Ti(NMe_2)_4$ as precursors; a LPCVD process using $Ti(NMe_2)_4$ in combination with an activated species which attacks the alkyl-nitrogen bonds of the primary precursor, and which will convert the displaced alkyl groups into a volatile compound. Each of these four processes has its associated problems.

Both reactive sputtering and nitrogen ambient annealing of deposited titanium result in films having poor step coverage, which are not useable in submicron processes. Chemical vapor deposition processes have an important advantage in that a conformal layers of any thickness may be deposited. This is especially advantageous in ultra-large-scale-integration circuits, where minimum feature widths may be smaller than $0.5\mu$. Layers as thin as 10 Å may be readily produced using CVD. However, TiN coatings prepared used the high-temperature APCVD process must be prepared at temperatures between 900°–1000° C. The high temperatures involved in this process are incompatible with conventional integrated circuit manufacturing processes. Hence, depositions using the APCVD process are restricted to refractory substrates such as tungsten carbide. The low-temperature APCVD, on the other hand, though performed within a temperature range of 100°–400° C. that is compatible with conventional integrated circuit manufacturing processes, is problematic because the precursor compounds (ammonia and $Ti(NR_2)_4$) react spontaneously in the gas phase. Consequently, special precursor delivery systems are required to keep the gases separated during delivery to the reaction chamber. In spite of special delivery systems, the highly spontaneous reaction makes full wafer coverage difficult to achieve. Even when achieved, the deposited films tend to lack uniform conformality, are generally characterized by poor step coverage, and tend to deposit on every surface within the reaction chamber, leading to particle problems. The LPCVD process which employs ammonia and $Ti(NMe_2)_4$ as precursors, though producing layers of uniform thickness, does not provide acceptable step coverage for high aspect ratio trenches. Finally, the LPCVD process using $Ti(NMe_2)_4$ in combination with an activated species requires a relatively complex combination of chemical vapor deposition and plasma generation equipment.

SUMMARY OF THE INVENTION

This invention is a process for depositing high-density, highly-conformal titanium nitride films which have very low bulk resistivity and excellent step coverage. The deposition process takes place in a low-pressure chamber (i.e., a chamber in which pressure has been reduced to between 0.1 and 100 Torr prior to deposition), and utilizes a metal-organic compound, tetrakis-dialkylamido-titanium $Ti(NR_2)_4$, as the primary precursor compound in combination with a halogen gas, such as $F_2$, $Cl_2$ or $Br_2$. The halogen gas molecule attacks the alkyl-nitrogen bonds of the primary precursor compound molecule, and converts the displaced alkyl groups into a volatile compound. Any noble gas, as well as nitrogen or hydrogen, or a mixture of two or more of the foregoing may be used as a carrier for the precursor. The wafer is heated to a temperature within a range of 200°–600° C. The halogen gas is admitted to the deposition chamber in one of three ways. The first way is to admit halogen gas into the deposition chamber before the primary precursor compound is admitted. During this "pre-conditioning" step, the halogen gas becomes adsorbed on the chamber and wafer surfaces. The LPCVD deposition process is then performed without admitting additional halogen gas into the deposition chamber. As a first alternative, the halogen gas and vaporized primary precursor compound are admitted into the deposition chamber simultaneously. Ideally, the halogen gas and vaporized primary precursor compound are introduced into the chamber via a single shower head having separate ducts for both the halogen gas and the vaporized primary precursor compound. Maintaining the halogen gas separate from the primary precursor compound until it has entered the deposition chamber prevents the deposition of titanium nitride on the show head. It is hypothesized that as soon as the mixing has occurred, the halogen molecules attack the primary precursor molecules and begin to tear away the alkyl groups therefrom. Relatively uncontaminated titanium nitride deposits on the heated wafer surface. As a second alternative, halogen gas is admitted into the chamber both before and during the introduction of the primary precursor compound.

PREFERRED EMBODIMENT OF THE INVENTION

Figure 1:
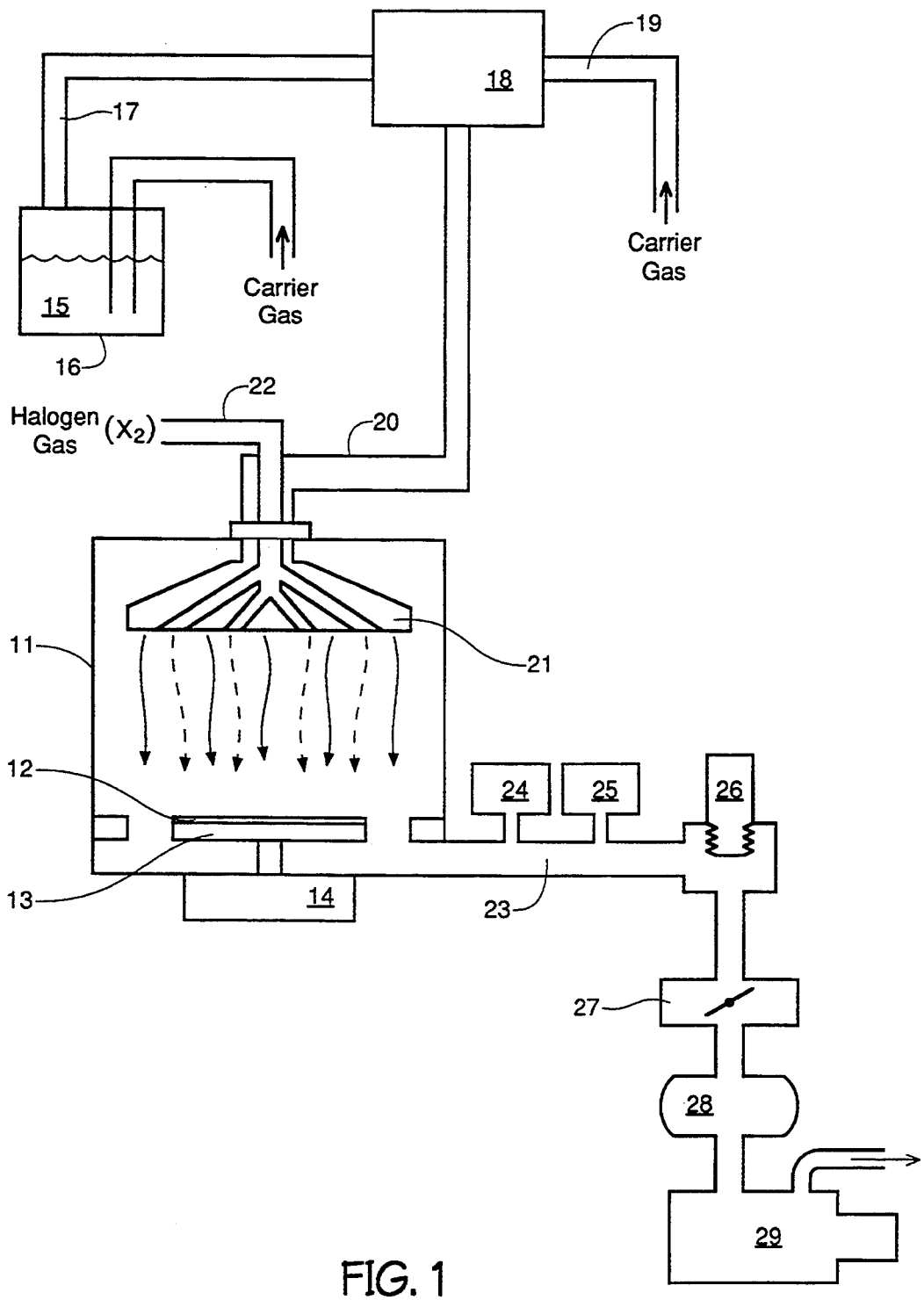
FIG. 1 is a block schematic diagram of a low-pressure chemical vapor deposition reactor system having a single shower head with separate ducts for the halogen gas and the primary precursor compound.

The new process for depositing high-density, highly-conformal titanium nitride films which have very low bulk resistivity and excellent step coverage, will first be described in reference to the low-pressure chemical vapor deposition reactor system depicted in FIG. 1. The deposition process takes place in a cold wall chamber 11 in which pressure has been reduced to between 0.1 and 100 torr. A pressure of 0.5 torr is deemed to be optimum. A wafer 12, on which the deposition will be performed, is mounted on a susceptor 13, which is heated to a temperature within a range of 200°–600° C. by a heat lamp array 14. A wafer temperature of about 400° C. is deemed to be optimum for integrated circuit manufacture. A carrier gas selected from the group consisting of the noble gases, nitrogen and hydrogen is bubbled through liquid tetrakis-dialkylamido-titanium 15, the primary precursor compound, in a bubbler apparatus 16. During experimental development of the process, a carrier gas flow rate of 100 scc/min. was maintained through the bubbler apparatus 16 during the deposition process, and the primary precursor compound 15 was maintained at a constant temperature of approximately 40° C. Other techniques for vaporizing a semivolatile compound are also known in the art and may be used in place of the bubbler apparatus.

Tetrakis-dialkylamido-titanium, or $Ti(R_2)_4$, molecularly consists of a titanium atom to which four nitrogen atoms are single bonded, with each nitrogen atom also being single bonded to a pair of alkyl groups. It should be noted that tetrakis-dialkylamido-titanium is a family of compounds, of which tetrakis-dimethylamido-titanium, tetrakis-diethylamido-titanium and tetrakis-dibutylamido-titanium has been synthesized. Because of its lower carbon content per unit of molecular weight, the first compound is preferred because there is less carbon available to be incorporated as an impurity into the film. Nevertheless, any of the three compounds or any combination of the three compounds are deemed to be operative for the present invention.

Referring once again to FIG. 1, the carrier gas, at least partially saturated with vaporized primary precursor compound 15, is transported via a primary intake manifold 17 to a mixing chamber 18, into which an optional secondary carrier gas may be injected via an auxiliary inlet 19. From the mixing chamber 18, the vaporized primary precursor compound 15 and accompanying carrier gases are ducted to a showerhead 21 within the deposition chamber 11. A halogen gas, $X_2$, selected from the group consisting of fluorine, chlorine and bromine is introduced into a secondary intake manifold 22 which transports the halogen gas to the showerhead 21. The halogen gas may optionally be diluted with one or more noble gases. The vaporized primary precursor compound 15 and the halogen gas $X_2$ are preferably not allowed to mix until after they leave the shower head 21, which has separate ducts for both the primary precursor compound 15 and the halogen gas $X_2$. The separation prevents the halogen gas from reacting with the primary precursor compound prematurely, thus preventing the deposition of titanium nitride within the showerhead.

The halogen gas $X_2$ is admitted to the deposition chamber 11 in one of three ways. The first way is to permit the halogen gas to flow through the deposition chamber before the primary precursor compound 15 is admitted. The deposition chamber is simultaneously evacuated through an exhaust manifold 23. During this "pre-conditioning" step, it is hypothesized that the halogen gas becomes adsorbed on the interior surfaces of the deposition chamber 11 and on the upper surface of the wafer 12. The flow of halogen gas is then stopped, and the LPCVD deposition process is performed without admitting additional halogen gas into the deposition chamber. Using the second approach, the halogen gas and vaporized primary precursor compound are admitted into the deposition chamber simultaneously. Using the latter technique, halogen gas flow is maintained at a level less than 5 sccm/minute. Using the third approach, halogen gas is admitted into the deposition chamber both before and during the introduction of the primary precursor compound.

It is hypothesized that as soon as the mixing of the halogen gas and the primary precursor compound has occurred, the halogen molecules begin to tear away the alkyl groups from the primary precursor molecules. Relatively uncontaminated titanium nitride deposits on the surface of the heated wafer 12. Reaction products and carrier gas are withdrawn from the chamber 11 via the exhaust manifold 23. Incorporated in the exhaust manifold 23 are a pressure sensor 24, a pressure switch 25, a vacuum valve 26, a pressure control valve 27, a blower 28, and a particulate filter 29, which filters out solid reactants before the exhaust is vented to the atmosphere. During the deposition process, the pressure within chamber 11 is maintained within a pressure of preferably, but not limited to, 0.1 to 100 torr by pressure control components 24, 25, 26, 27 and 28.

Although only chlorine gas has been utilized experimentally, it is assumed (on the basis of the experimental results obtained from the experiments associated with the application of which this application is a continuation-in-part) that fluorine gas will also react similarly. In those previous experiments, it was found that active fluorine species (generated by subjecting $NF_3$ to a remote plasma) reacted with the primary precursor compound to deposit titanium nitride. Since fluorine gas is even more reactive than chlorine gas, it seems highly unlikely that fluorine gas would not attack the primary precursor molecule with at least the same degree of reactivity as chlorine gas. It is also believed that there is a high probability that bromine gas will have the same effect. However, due to the difficulty of handling elemental bromine, experiments with bromine have not yet been performed.

Experimental results were obtained for the LPCVD process utilizing the primary precursor compound in combination with chlorine gas. Additionally, a control process was run in which the primary precursor compound was pyrolized in the absence of chlorine. The following chart provides bulk resistivity values for films having a thickness of about 150 Å deposited using both processes.

| Process | Resistivity (in μohm-cm) |
|---------|--------------------------|
| Control | 15,000–30,000 |
| $Cl_2$ | 100–5,000 |

The ranges obtained in the experimental results are a function of certain second order effects which control the degree of oxidation of the deposited film in the atmosphere and, hence, resistivity.

Aspect ratio of a contact opening is defined as the ratio of the depth of the opening to the diameter of the opening. Thus, a contact opening having an aspect ratio of 5 will have a depth that is five times it diameter. Conformality of a deposited layer is generally defined as the ratio of the thickness of that layer near the bottom of a contact opening to the thickness of that layer on the horizontal surface near he contact opening. The conformality of the titanium nitride films deposited by the subject process within 0.5μ-wide, 2.5μ-deep contact opening has been experimentally observed to be within a range of 90–95 percent. Uniformity over the surface of the wafer has been observed to be within a range of 5 percent of the average thickness.

Although only several embodiments of the inventive process have been disclosed herein, it will be obvious to those having ordinary skill in the art of chemical vapor deposition that modifications and changes may be made thereto without affecting the scope and spirit of the invention as claimed. For example, other organometallic titanium compounds which have bonds with reactivities similar to those of tetrakis-dialkylamido-titanium will likely react in a similar manner and with similar results. It is also to be understood that the process parameters disclosed herein are meant to be illustrative, and are not meant to be limiting. In addition, it should be understood that titanium nitride may be deposited on substrates other than a semiconductor wafers using the subject process.

I claim:

1. A chemical vapor deposition process for depositing a titanium nitride film on the surface of a substrate, said process comprising the steps of:
    (a) disposing the substrate within a chemical vapor deposition chamber which has been evacuated to a pressure within a range of 0.1–100 torr;
    (b) introducing an unactivated halogen gas into said chamber;
    (c) heating the substrate to a temperature within a range of 200°–600° C.;
    (d) introducing a vaporized organometallic compound into said chamber after the heating step is accomplished; and
    (e) maintaining the substrate within the chamber until a layer of titanium nitride having a desired thickness has deposited on said surface.

2. The process of claim 1, wherein said organometallic compound is tetrakis-dialkylamido-titanium.

3. The process of claim 1, wherein said organometallic compound is tetrakis-dimethylamido-titanium.

4. The process of claim 1, wherein said substrate is positioned on a heated susceptor plate, and heat is transferred from said susceptor plate to said substrate.

5. The process of claim 1, wherein said halogen gas is selected from the group consisting of fluorine gas, chlorine gas and bromine gas.

6. The process of claim 1, wherein said substrate is heated to a temperature of about 400° C.

7. The process of claim 1, wherein said at least one carrier gas is utilized to transport the vaporized organometallic compound into the chamber.

8. The process of claim 7, wherein said carrier gas is selected from the group consisting of the noble gases, nitrogen and hydrogen.

9. The process of claim 3, wherein said halogen gas is introduced into the chamber prior to the introduction of said organometallic compound, said halogen gas becoming adsorbed on the walls of the chamber and on the surface of the substrate.

10. The process of claim 3, wherein said halogen gas is introduced into the chamber simultaneously with the organometallic compound.

11. The process of claim 10, wherein the flow rate of said halogen gas is less than 5 scc/minute.

12. The process of claim 3, wherein said halogen gas is introduced into the chamber both before and during the introduction of the organometallic compound.

13. A chemical vapor deposition process for depositing a titanium nitride film on the surface of a substrate, said process comprising the steps of:
    (a) disposing the substrate within a chemical vapor deposition chamber which has been evacuated to a pressure within a range of 0.1–100 torr;
    (b) introducing an unactivated halogen gas selected from the group consisting of fluorine, chlorine and bromine into said chamber;
    (c) heating the substrate to a temperature within a range of 200°–600° C.;
    (d) introducing vaporized tetrakis-dialkylamido-titanium into said chamber after the heating step is accomplished; and
    (e) maintaining the substrate within the chamber until a layer of titanium nitride having a desired thickness has deposited on said surface.

14. The process of claim 13, wherein tetrakis-dialkylamido-titanium is tetrakis-dimethylamido-titanium.

15. The process of claim 13, wherein said substrate is positioned on a heated susceptor plate, and heat is transferred from said susceptor plate to said substrate.

16. The process of claim 13, wherein said substrate is heated to a temperature of about 400° C.

17. The process of claim 13, wherein tetrakis-dialkylamido-titanium is introduced into the chamber in combination with at least one carrier gas selected from the group consisting of the noble gases, nitrogen and hydrogen.

18. The process of claim 13, wherein said halogen gas is introduced into the chamber prior to the introduction of said organometallic compound, said halogen gas becoming adsorbed on the walls of the chamber and on the surface of the substrate.

19. The process of claim 13, wherein said halogen gas is introduced simultaneously with the tetrakis-dialkylamido-titanium.

20. The process of claim 19, wherein the flow rate of halogen gas is less than 5 scc/minute.

* * * * *